United States Patent
Lee et al.

(10) Patent No.: US 9,721,635 B2
(45) Date of Patent: Aug. 1, 2017

(54) ELECTRONIC DEVICE HAVING SEMICONDUCTOR MEMORY COMPRISING VARIABLE RESISTANCE ELEMENTS FOR STORING DATA

(71) Applicant: SK hynix Inc., Icheon-Si (KR)

(72) Inventors: Min-Hye Lee, Icheon-Si (KR); Ji-Hyae Bae, Icheon-Si (KR); Yong-Ho Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 64 days.

(21) Appl. No.: 14/501,959

(22) Filed: Sep. 30, 2014

(65) Prior Publication Data

US 2015/0294702 A1    Oct. 15, 2015

(30) Foreign Application Priority Data

Apr. 10, 2014   (KR) ........................ 10-2014-0042989

(51) Int. Cl.
*G11C 13/00* (2006.01)
*G11C 11/16* (2006.01)
(Continued)

(52) U.S. Cl.
CPC ...... *G11C 11/1673* (2013.01); *G11C 11/1659* (2013.01); *G11C 13/003* (2013.01); *G11C 13/004* (2013.01); *H01L 27/228* (2013.01); *G11C 13/0004* (2013.01); *G11C 13/0007* (2013.01); *G11C 2213/74* (2013.01);
(Continued)

(58) Field of Classification Search
CPC . G11C 11/1673; G11C 13/003; G11C 13/004; G11C 11/1659; G11C 13/0004; G11C 13/0007; G11C 2213/78; G11C 2213/79; H01L 27/2463; H01L 45/04; H01L 27/228

See application file for complete search history.

(56) References Cited

U.S. PATENT DOCUMENTS 7,016,222 B2 *  3/2006  Morikawa ............... G11C 11/15
                                                365/148
8,432,727 B2 *  4/2013  Ryu ........................ G11C 11/16
                                                365/148

(Continued)

FOREIGN PATENT DOCUMENTS

KR   10-2004-0049288 A    6/2004
KR   10-2008-0046123 A    5/2008

*Primary Examiner* — Douglas King
(74) *Attorney, Agent, or Firm* — Perkins Coie LLP

(57) ABSTRACT

Provided are, among others, memory circuits or devices and their applications in electronic devices or systems and various implementations of an electronic device which includes two variable resistance elements in each storage cell, thereby increasing margin and speed of a read operation. One disclosed electronic device includes a semiconductor memory unit which, in one implementation, in addition to two variable resistance elements, further includes a bit line and a bit line bar formed at a metal level; a first word line formed at a transistor level lower than the metal level, and extended in a direction perpendicular to the bit line or the bit line bar; a first selecting element formed at the transistor level and coupled to the bit line and the first word line; a second selecting element formed at the transistor level and coupled to the bit line bar and the first word line.

15 Claims, 12 Drawing Sheets

(51) Int. Cl.
*H01L 27/22* (2006.01)
*H01L 27/24* (2006.01)

(52) U.S. Cl.
CPC ...... *G11C 2213/78* (2013.01); *G11C 2213/79* (2013.01); *G11C 2213/82* (2013.01); *H01L 27/2436* (2013.01); *H01L 27/2463* (2013.01)

(56) References Cited

U.S. PATENT DOCUMENTS

| | | | | |
|---|---|---|---|---|
| 9,147,458 | B2* | 9/2015 | Noguchi | G11C 11/1675 |
| 2002/0057593 | A1* | 5/2002 | Hidaka | B82Y 10/00 |
| | | | | 365/171 |
| 2003/0142527 | A1* | 7/2003 | Yamada | G11C 11/16 |
| | | | | 365/63 |
| 2007/0159870 | A1* | 7/2007 | Tanizaki | G11C 11/16 |
| | | | | 365/148 |
| 2010/0091549 | A1* | 4/2010 | Lee | G11C 11/16 |
| | | | | 365/148 |
| 2011/0211390 | A1* | 9/2011 | Hanzawa | G11C 13/0004 |
| | | | | 365/163 |
| 2012/0243297 | A1* | 9/2012 | Katayama | G11C 11/1659 |
| | | | | 365/148 |
| 2013/0322161 | A1* | 12/2013 | Noguchi | G11C 11/1675 |
| | | | | 365/158 |

* cited by examiner

ELECTRONIC DEVICE HAVING SEMICONDUCTOR MEMORY COMPRISING VARIABLE RESISTANCE ELEMENTS FOR STORING DATA

CROSS-REFERENCE TO RELATED APPLICATIONS

This patent document claims priority of Korean Patent Application No. 10-2014-0042989, entitled "ELECTRONIC DEVICE" and filed on Apr. 10, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes two variable resistance elements in each storage cell, thereby increasing margin and speed of a read operation.

In one aspect, an electronic device including a semiconductor memory unit is provided. The semiconductor memory unit may include: a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element; a second variable resistance element formed between the metal level and the transistor level, and coupled to the second selecting element; and a first sinking element formed at the transistor level, coupled to the first and second variable resistance elements, and operable to supply a ground voltage to the first and second variable resistance elements when turned on.

In another aspect, an electronic device including a semiconductor memory unit is provided. The semiconductor memory unit may include: a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on In some implementations, the semiconductor memory unit may include a first ground voltage line formed at the metal level between the bit line and the bit line bar, extended in the direction parallel to the bit line or bit line bar, and coupled to the first sinking element to receive a ground voltage.

In some implementations, the first sinking element and the first ground voltage line may be coupled through a contact.

In some implementations, the semiconductor memory unit may include a first ground voltage line formed at the transistor level, extended in the direction perpendicular to the bit line or bit line bar, coupled to the first sinking element to receive a ground voltage.

In some implementations, the semiconductor memory unit may further include: a first contact formed between the transistor level and the metal level to couple the bit line to the first selecting element; and a second contact formed between the transistor level and the metal level to couple the bit line bar to the second selecting element.

In some implementations, the semiconductor memory unit further may include a first read signal line formed at the transistor level, extended in the direction perpendicular to the bit line or the bit line bar, coupled to a gate of the first sinking element, and operable to turn on the first sinking element during a read operation.

In some implementations, the semiconductor memory unit may further include: a third contact formed between the metal level and the transistor level and extended in the direction perpendicular to the bit line or the bit line bar to be coupled with the first and second variable resistance elements; and a fourth contact coupling the third contact to the sinking element.

In some implementations, the semiconductor memory unit may further include: a second word line formed at the transistor level, and extended in the direction perpendicular to the bit line or the bit line bar; a third selecting element formed at the transistor level and coupled to the bit line and the second word line, and operable to be turned on or off in response to a voltage of the second word line; a fourth selecting element formed at the transistor level, and coupled to the bit line bar and the second word line, and operable to be turned on or off in response to the voltage of the second word line; a third variable resistance element formed between the metal level and the transistor level, and coupled to the third selecting element; a fourth variable resistance element formed between the metal level and the transistor level, and coupled to the fourth selecting element; a second sinking element formed at the transistor level, coupled to the third and fourth variable resistance elements, and operable to supply a ground voltage to the third and fourth variable resistance elements when turned on; and a second read signal line formed at the transistor level, extended in the direction perpendicular to the bit line or bit line bar, coupled to a gate of the second sinking element, and operable to turn on the second sinking element during a read operation, and wherein the first word line, the first read signal line, the second read signal line, and the second word line may be sequentially arranged.

In some implementations, the semiconductor memory unit may further include: a second word line formed at the transistor level, and extended in the direction perpendicular to the bit line or the bit line bar; a third selecting element formed at the transistor level and coupled to the bit line and the second word line, and operable to be turned on or off in response to a voltage of the second word line; a fourth selecting element formed at the transistor level, and coupled to the bit line bar and the second word line, and operable to be turned on or off in response to the voltage of the second word line; a third variable resistance element formed between the metal level and the transistor level, and coupled to the third selecting element, the third variable resistance element configured to exhibit two different resistance values when a current flowing therethrough is switched between opposite directions; a fourth variable resistance element formed between the metal level and the transistor level, and coupled to the fourth selecting element, the fourth variable resistance element configured to exhibit two different resistance values when a current flowing therethrough is switched between opposite directions; a second sinking element formed at the transistor level, coupled to the third and fourth variable resistance elements, and operable to supply a ground voltage to the third and fourth variable resistance elements when turned on; and a second read signal line formed at the transistor level, extended in the direction perpendicular to the bit line or bit line bar, coupled to a gate of the second sinking element, and operable to turn on the second sinking element during a read operation, and wherein the first word line, the first read signal line, the second read signal line, and the second word line may be sequentially arranged.

In some implementations, the first to fourth variable resistance elements have a resistance value which is switched to a second resistance value when a switching current flows from one end to the other end thereof, and switched to a first resistance value when the switching current flows from the other end to the one end thereof.

In some implementations, the first and second sinking elements may be coupled to each other to receive a common ground voltage to supply to the first and second variable resistance elements from the first sinking element and to the third and fourth variable resistance elements from the second sinking element.

In some implementations, the semiconductor memory unit may compare a current flowing in the first variable resistance element with a current flowing in the second variable resistance element during a read operation.

In some implementations, the semiconductor memory unit further comprises: a first storage cell comprising the bit line/bit line bar, the first selecting element, the second selecting element, the first variable resistance element, the second variable resistance element, and the first sinking element; and a second storage cell comprising the bit line/bit line bar, the third selecting element, the fourth selecting element, the third variable resistance element, the fourth variable resistance element, and the second sinking element, when the first data is stored in the first and second storage cells, the switching current is passed from the other end to the one end in the first and third variable resistance elements, and passed from the one end to the other end in the second and fourth variable resistance elements, and when the second data is stored in the first and second storage cells, the switching current is passed from the one end to the other end in the first and third variable resistance elements, and passed from the other end to the one end in the second and fourth variable resistance elements.

In some implementations, the two different resistance values of each of the first, second, third and fourth variable resistance elements may be a high resistance value and a low resistance value, and wherein the first and the second variable resistance elements may be configured to exhibit opposite resistance values when a current is direct in the same direction to flow through the first sinking element, and the third and the fourth variable resistance elements are configured to exhibit opposite resistance values when a current is direct in the same direction to flow through the second sinking element.

In some implementations, the electronic device may further include a microprocessor which includes a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which includes a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which includes a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, an electronic device is provided to include a semiconductor memory unit which includes: a substrate; one or more bit lines and one or more bit line bars formed over the substrate at a metal level and extended to be parallel to each other, a bit line being arranged next to a bit line bar; a plurality of word lines formed over the substrate at a transistor level lower than the metal level, and extended in a direction perpendicular to the bit line and the bit line bar; a plurality of storage cells over the substrate and coupled between the one or more bit lines and the one or more bit line bars, respectively, different storage cells coupled to a pair of a bit line and a corresponding bit line bar being coupled to the word lines, respectively, each storage cell including a first variable resistance element having a first resistance value when the first data is stored therein and having a second resistance value when the second data is stored therein and a second variable resistance element having the second resistance value when the first data is stored therein and having the first resistance value when the second data is stored therein, and selected in response to the voltage of the corresponding word line; and one or more ground voltage lines each suitable for applying a ground voltage to a corresponding storage cell during a read operation.

In some implementations, each of the one or more ground voltage lines may be formed over the substrate at the metal level between the corresponding bit line or bit line bar, and extended in a direction parallel to the bit line or bit line bar.

In some implementations, each of the one or more ground voltage lines may be formed at the transistor level, arranged between two adjacent storage cells, and extended in the direction perpendicular to the bit line or bit line bar.

In some implementations, each of the storage cells may further include: a first selecting element formed at the transistor level, having one end coupled to the bit line and the other end coupled to one end of the first variable resistance element, and operable to be turned on or off in response to a voltage of a corresponding word line; a second selecting element formed at the transistor level and having one end coupled to the bit line bar and the other end coupled to one end of the second variable resistance element, and operable to be turned on or off in response to the voltage of the corresponding word line; and a sinking element formed at the transistor level and having two terminals one of which is coupled to the first and second variable resistance elements and the other of which is coupled to a corresponding ground voltage line, and wherein the sinking element provides a ground voltage from the corresponding ground voltage line to the first and second variable resistance elements in response to a read enable signal which is activated during a read operation.

In some implementations, two adjacent storage cells that are adjacent in a direction parallel to the bit line or the bit line bar may be arranged to form a mirror-image pattern and share a corresponding ground voltage line.

In some implementations, resistance values of the first and second variable resistance elements may be switched according to a direction of the switching current flowing therethrough.

In some implementations, wherein when the first data is stored in the storage cell, the semiconductor memory unit passes a switching current from the one end to the other end in the first variable resistance element, and passes the switching current from the other end to the one end in the second variable resistance element, and when the second data is stored in the storage cell, the semiconductor memory unit passes the switching current from the other end to the one end in the first variable resistance element, and passes the switching current from the one end to the other end in the second variable resistance element.

In some implementations, the semiconductor memory unit may compare a current flowing in the first variable resistance element with a current flowing in the second variable resistance element during a read operation.

In some implementations, the electronic device may further include a microprocessor which includes a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which includes a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which includes a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

Semiconductor devices in accordance with implementations may include variable resistance elements. The variable resistance element may exhibit a variable resistance characteristic and include a single layer or multilayer. For example, the variable resistance element may include a material used for RRAM, PRAM, MRAM, FRAM or the like, for example, a chalcogenide-based compound, a transition metal compound, a ferroelectric material, a ferromagnetic material or the like. However, implementations of the disclosed technology are not limited the above examples of variable resistance elements and other forms of variable resistance elements may be used. The variable resistance element may include various materials or structures as long as the materials have a variable resistance characteristic of which the resistance state exhibits two different resistance states and can be switched between the different resistance states according to a voltage or current applied across the materials.

For example, the variable resistance element may include a metal oxide. The metal oxide may include a transition metal oxide such as nickel (Ni) oxide, titanium (Ti) oxide, hafnium (Hf) oxide, zirconium (Zr) oxide, tungsten (W)

oxide or cobalt oxide (Co), or a perovskite-based material such as STO (SrTiO) or PCMO (PrCaMnO). Such a variable resistance element may exhibit a characteristic of switching between different resistance states through formation or disappearance of a current filament based on the behavior of vacancies.

Furthermore, the variable resistance element may include a phase change material. The phase change material may include, for example, a chalcogenide-based material such as GST (Ge—Sb—Te). In some implementations, for example, a variable resistance element may be stabilized into any one of a crystalline state and an amorphous state by heat, thereby exhibiting a characteristic of switching between different resistance states.

Furthermore, the variable resistance element may include a structure having two magnetic layers and a tunnel barrier layer interposed therebetween. Such a magnetic layer may be formed of NiFeCo or CoFe, and the tunnel barrier layer may be formed of $Al_2O_3$ or the like. The variable resistance element may exhibit a characteristic of two different resistance states according to the magnetization directions of the magnetic layers and capability of being switched between the two states in response to an applied signal such as a current or voltage. For example, the variable resistance element may have a low resistance state when the magnetization directions of the two magnetic layers are parallel to each other, and have a high resistance state when the magnetization directions of the two magnetic layers are anti-parallel to each other to be in opposite directions.

Figure 1:
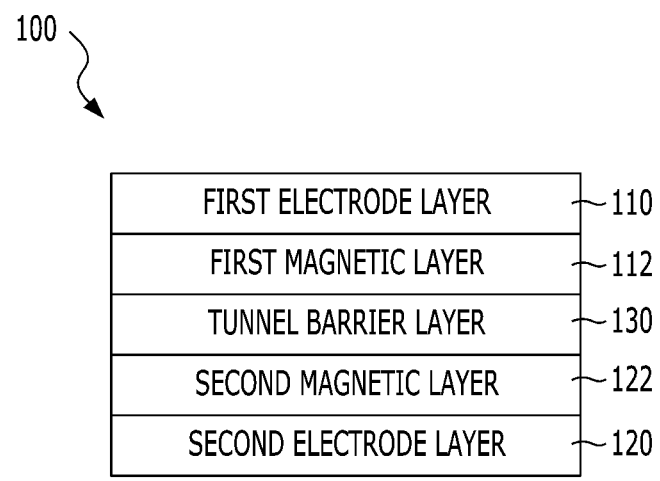
FIG. 1 illustrates an implementation of a magnetic tunnel junction (MTJ) which is one of structures having two magnetic layers and a tunnel barrier layer interposed therebetween.

FIG. 1 illustrates an implementation of a magnetic tunnel junction (MTJ) which is one of structures having two magnetic layers and a tunnel barrier layer interposed therebetween.

As illustrated in FIG. 1, the MTJ 100 includes a first electrode layer 110 serving as a top electrode, a second electrode layer 120 serving as a bottom electrode, a pair of first and second magnetic layers 112 and 122, and a tunnel barrier layer 130 formed between the pair of magnetic layers 112 and 122.

The first magnetic layer 112 may include a free ferromagnetic layer of which the magnetization direction is varied according to the direction of a current applied to the MTJ 100, and the second magnetic layer 122 may include a pinned ferromagnetic layer of which the magnetization direction is pinned to a fixed direction.

The MTJ 100, of which the resistance value is changed according to the direction of the current, may store data "0" or "1".

Figure 2A:
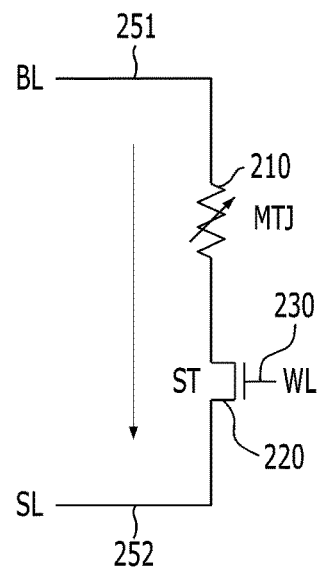
FIGS. 2A and 2B are diagrams for explaining the principle of storing data in a variable resistance element.
Figure 2B:
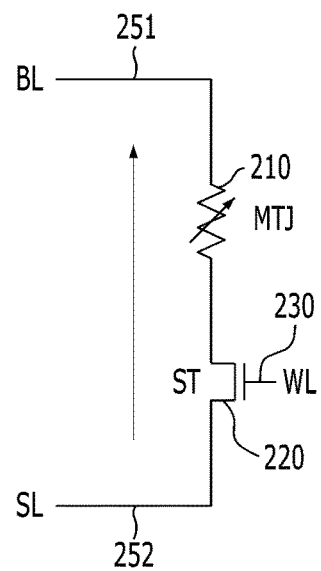

FIGS. 2A and 2B are diagrams for explaining the principle of storing data in a variable resistance element 210. The variable resistance element 210 may include the MTJ 100 described with reference to FIG. 1.

FIG. 2A is a diagram for explaining the principle that low data is stored in the variable resistance element 210. In order to select the variable resistance element 210 in which data is intended to be stored, a word line 230 coupled to the variable resistance element 210 may be enabled to turn on a transistor 220 as a switching transistor (ST). This can be achieved by turning on the transistor 220 coupled to the variable resistance element 210 under an applied voltage at the word line 230 coupled to the gate of the transistor 220 in the example shown in FIG. 2A. Once the transistor 220 is turned on, a current can be directed to flow from one end 251 toward the other end 252, that is, from the first electrode layer 110 serving as the top electrode to the second electrode layer 120 serving as the bottom electrode of the MTJ 100 in FIG. 1 (along the arrow direction). The variable resistance element 210 may have a low resistance state when the magnetization direction of the first magnetic layer 110 corresponding to the free ferromagnetic layer is or becomes parallel to the magnetization direction of the second magnetic layer 122 corresponding to the pinned ferromagnetic layer. When the variable resistance element 210 has a low resistance state, it may be defined that low data is stored in the variable resistance element 210.

FIG. 2B is a diagram for explaining the principle that high data is stored in the variable resistance element 210. Similarly, the word line 230 coupled to the transistor 220 (which is coupled to the variable resistance element 210) may be enabled to turn on the transistor 220 to allow a current to flow from the other end 252 to the one end 251, that is, from the second electrode layer 120 to the first electrode layer 110 (along the arrow direction). The variable resistance element 210 may have a high resistance state when the magnetization direction of the first magnetic layer 112 is or becomes anti-parallel to the magnetization direction of the second magnetic layer 122. When the variable resistance element 210 has a high resistance state, it may be defined that high data is stored in the variable resistance element 210.

Figure 3:
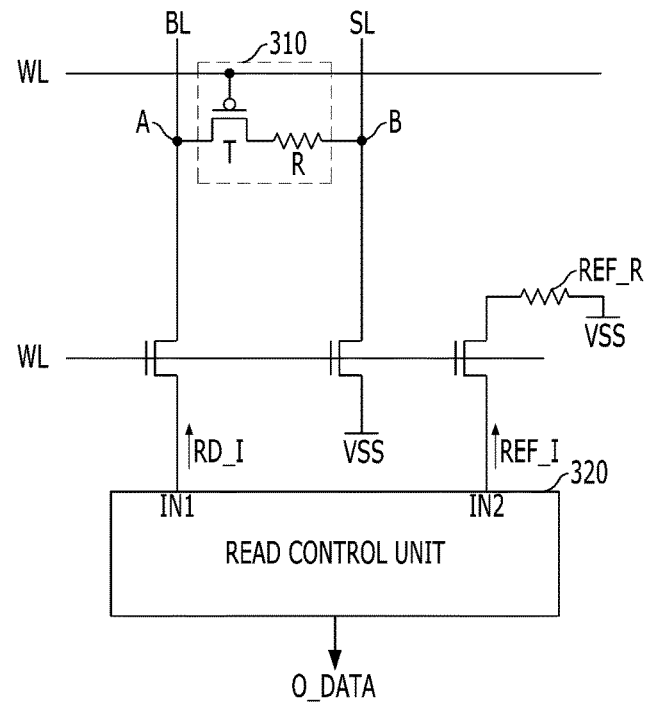
FIG. 3 illustrates a storage cell 310 including a variable resistance element and components required for reading data of the storage cell 310.

FIG. 3 illustrates an example of a storage cell 310 including a variable resistance element and components for reading data of the storage cell 310.

As illustrated in FIG. 3, a memory circuit (device) may include a bit line BL, a source line SL, a word line WL, a storage cell 310, a reference resistance element REF_R, and a read control unit 320.

The storage cell 310 may include a variable resistance element R and a selecting element T which can be a transistor as shown in FIGS. 2A and 2B. The variable resistance element R may have a resistance value which is changed in response to a switching current flowing across the variable resistance element R. The selecting element T may be coupled to one end of the variable resistance element R and turned on the electrical path to the variable resistance element R when the word line WL is activated. The storage cell 310 may have one end A coupled to the bit line BL and the other end B coupled to the source line SL.

The variable resistance element R may include a first state having a first resistance value and a second state having a second resistance value higher than the first resistance value. The first state may correspond to the above-described low resistance state, and the second state may correspond to the above-described high resistance state. The first state of the variable resistance element R may be defined as a state in which low data is stored, and the second state of the variable resistance element R may be defined as a state in which high data is stored. Alternatively, the first state of the variable resistance element R may be defined as a state in which high data is stored, and the second state of the variable resistance element R may be defined as a state in which low data is stored. The reference resistance element REF_R is coupled to the storage cell 310 in connection with a read control unit 320 and may have a resistance value between the first and second resistance values.

The bit line BL may be coupled to a first input terminal IN1 of the read control unit 320 through a coupling element RT. The source line SL may be coupled to a ground voltage terminal VSS through the coupling element RT. One end of the reference resistance element REF_R may be coupled to a second input terminal IN2 of the read control unit 320 through the coupling element RT and the other end of the reference resistance element REF_R may be coupled to the ground voltage terminal VSS.

During a read operation, a read enable signal RDEN is activated. In response to the read enable signal RDEN activated, the coupling terminal RT may be turned on to couple the bit line BL to the first input terminal IN1 of the read control unit 320, a ground voltage VSS may be applied to the source line SL, and the one end of the reference resistance element REF_F is coupled to the second input terminal IN2 of the read control unit 320. If the word line WL is selected during the read operation, the selecting element T may be turned on to pass a current through the storage cell 310.

During the read operation, a read current RD_I flows in the storage cell 310 and a reference current REF_I flows in the reference resistance element REF_R. The read control unit 320 may compare the resistance values of the variable resistance element R and the reference resistance element REF_R using the read current RD_I and the reference current REF_I. The read control unit 320 may read data stored in the storage cell 310 based on the comparison between the resistance values of the variable resistance element R and the reference resistance element REF_R. When the resistance value of the variable resistance element R is smaller than the reference value of the reference resistance element REF_R, the resistance value of the variable resistance element R may be set to the first resistance value. When the resistance value of the variable resistance element R is larger than the resistance value of the reference resistance element REF_R, the resistance value of the variable resistance element R may be set to the second resistance value. The read control unit 320 may output the read data as data O_DATA.

When the reference resistance element REF_R has a resistance value corresponding to an intermediate value between the first and second resistance values, a read margin may be measured as the half of the difference between the first and second resistance values. If the read margin is reduced, errors are more likely to occur and the number of errors increases. To reduce the number of errors, reading time may be increased such that a sufficiently long time is provided in reading data.

Figure 4:
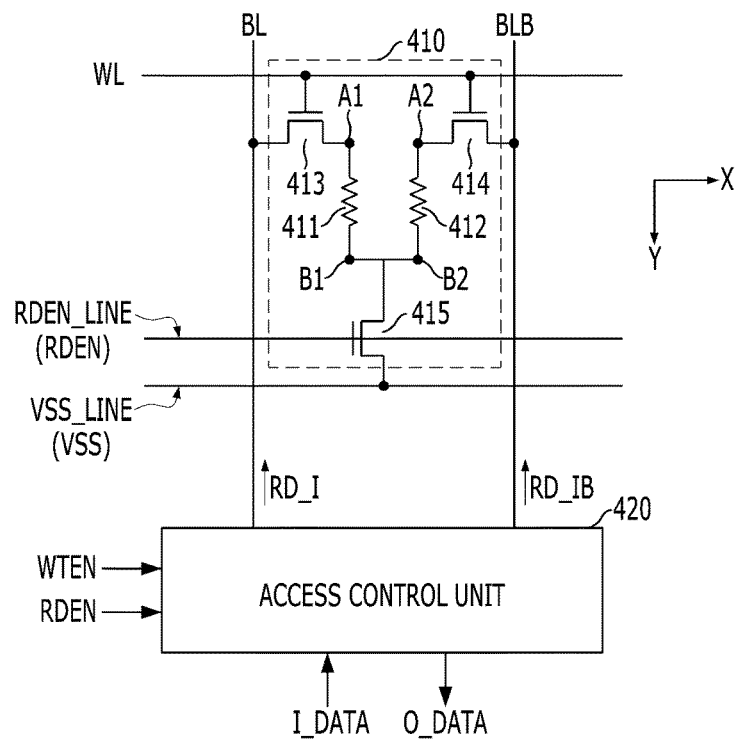
FIG. 4 is a configuration diagram of a memory circuit (device) which includes a storage cell 410 having two variable resistance elements 411 and 412.

FIG. 4 is an example of a configuration diagram of a memory circuit or device which includes a storage cell 410 having two variable resistance elements 411 and 412.

As illustrated in FIG. 4, the memory circuit may include a storage cell 410, a bit line BL, a bit line bar BLB, a word line WL, a read signal line RDEN_LINE, a ground voltage line VSS_LINE, and an access control unit 420.

As illustrated in FIG. 4, the storage cell 410 may include a first variable resistance element 411, a second variable resistance element 412, a first selecting element 413 (e.g., a transistor), a second selecting element 414 (e.g., a transitor), and a sinking element 415. The storage cell 410 illustrated in FIG. 4 may store, for example, an one-bit data.

The resistance values of the variable resistance elements 411 and 412 may be switched according to the direction in which a switching current flows. For example, when the switching current flows in a direction from A1 to B1 or from A2 to B2, the resistance values of the variable resistance element 411 and 412 may be switched to the first resistance value. Alternatively, when the switching current flows in a direction from A1 to B1 or from A2 to B2, the resistance values of the variable resistance element 411 and 412 may be switched to the second resistance value.

The storage cell 410 may store either first data or second data. In one implementation, the first data and the second data may indicate high data and low data, respectively. In another implementation, the first data and the second data may indicate low data and high data, respectively. Consider a case as an example where it is assumed that the first data and the second data correspond to low data and high data, respectively.

The storage cell 410 may be coupled between the bit line BL and the bit line bar BLB. The storage cell 410 may be selected in response to the voltage of the corresponding word line WL applied to the two variable resistance elements 411 and 412. The bit line BL may be used to transmit the same data as data stored in the storage cell 410, and the bit line bar BLB may be used to transmit the opposite data to the data stored in the storage cell 410. For example, the first selecting element 413 may have three terminals: its one end terminal is coupled to the bit line BL, the other end terminal is coupled to one end A1 of the first variable resistance element 411, and its gate serves as the third terminal that is coupled to the word line WL. Similarly, the second selecting element 414 may have three terminals: its one end terminal is coupled to the bit line bar BLB, the other end terminal is coupled to one end A2 of the second variable resistance element 412, and its gate serves as the third terminal that is coupled to the word line WL.

The sinking element 415 is commonly shared by the two variable resistance elements 411 and 412 and may have three terminals: its one end terminal is coupled to the other end B1 of the first variable resistance element 411 and the other end terminal B2 of the second variable resistance element 412 where B1 and B2 are connected to each other, and its second end terminal is coupled to the ground voltage line VSS_LINE, and its third end terminal is its gate which is coupled to the read signal line RDEN_LINE. The ground voltage VSS may be applied to the ground voltage line VSS_LINE, and a read enable signal RDEN which is activated during a read operation may be applied to the read signal line RDEN_LINE. When the read enable signal RDEN is activated, the sinking element 415 may be turned on to apply the ground voltage VSS to the other end B1 of the first variable resistance element 411 and the other end B2 of the second variable resistance element 412.

During a write operation, when a write enable signal WTEN is activated, the word line WL is activated. The selecting elements 413 and 414 may be turned on, and the sinking element 415 may be turned off. The access control unit 420 may pass a switching current to the storage cell 410 in a direction determined by input data I_DATA, when the write enable signal WTEN is activated. When the first data (low data) is written to the storage cell 410, the access control unit 420 may pass the switching current in a direction from the bit line bar BLB to the bit line BL. When the second data (high data) is written to the storage cell 410, the access control unit 420 may pass the switching current in a direction from the bit line BL to the bit line bar BLB. In the former case that the first data (low data) is written to the storage cell, the resistance value of the first variable resistance element 411 may be switched to the first resistance value (switching current flows from B1 to A1), and the resistance value of the second variable resistance element 412 may be switched to the second resistance value (switching current flows from A2 to B2). In the latter case that the second data (high data) is written to the storage cell 410, the switching current flows in the opposite direction to the former case. In this case, the resistance value of the first variable resistance element 411 may be switched to the second resistance value, and the resistance value of the second variable resistance element 412 may be switched to the first resistance value.

When data is written to the storage cell 410, the switching current flows through the first and second variable resistance elements 411 and 412 in opposite directions. Thus, the first and second variable resistance elements 411 and 412 may be switched to have different resistance values from each other. In the above-described example, when the first data (low data) is stored in the storage cell 410, the first and second variable resistance elements 411 and 412 may have the first and second resistance values, respectively, and when the second data (high data) is stored in the storage cell 410, the first and second variable resistance elements 411 and 412 may have the second and first resistance values, respectively.

During a read operation, when the read enable signal RDEN is activated and the word line WL is activated, the selecting elements 413 and 414 and the sinking element 415 may be turned on. When the sinking element 415 is turned on, the ground voltage VSS may be applied to the other end B1 of the first variable resistance element 411 and the other end B2 of the second variable resistance element 412. When the read enable signal RDEN is activated, the access control unit 420 may provide a first read current RD_I flowing from the bit line BL to the ground voltage line VSS_LINE through the first variable resistance element 411 and a second read current RD_IB flowing from the bit line bar BLB to the ground voltage line VSS_LINE through the second variable resistance value 412.

The amount of the first read current RD_I may correspond to the resistance value of the first variable resistance element 411, and the amount of the second read current RD_IB may correspond to the resistance value of the second variable resistance element 412. The access control unit 420 may compare the resistance values of the variable resistance elements R1 and R2 using the read currents RD_I and RD_IB to determine data stored in the storage cell, and output data determined as data O_DATA.

In the case of the storage cell 310 of FIG. 3, the comparison for determining data stored in the storage cell is performed between the resistance values of the variable resistance element and the reference resistance element. The variable resistance element has the first or second resistance value, and the reference resistance element has a resistance value between the first and second resistance values. Thus, the read margin may correspond to the half of the difference between the first and second resistance values. On the other hand, in the case of the storage cell 410 of FIG. 4A, the comparison for determining data stored in the storage cell is performed between the resistance values of the first and second variable resistance elements 411 and 412. The first and second variable resistance elements 411 and 412 have opposite resistance values. For example, if the first variable resistance element 411 has the first resistance value, the second variable resistance element 412 has the second resistance value. If the first variable resistance element 411 has the second resistance value, the second variable resistance element 412 has the first resistance value. Thus, the read margin may increase to correspond to the difference between the first and second resistance values. As the margin is increased, the read time required for sensing data during the read operation may be reduced. As a result, the memory circuit (device) including the storage cell 410 of FIG. 4A may perform a high-speed operation.

Figure 5A:
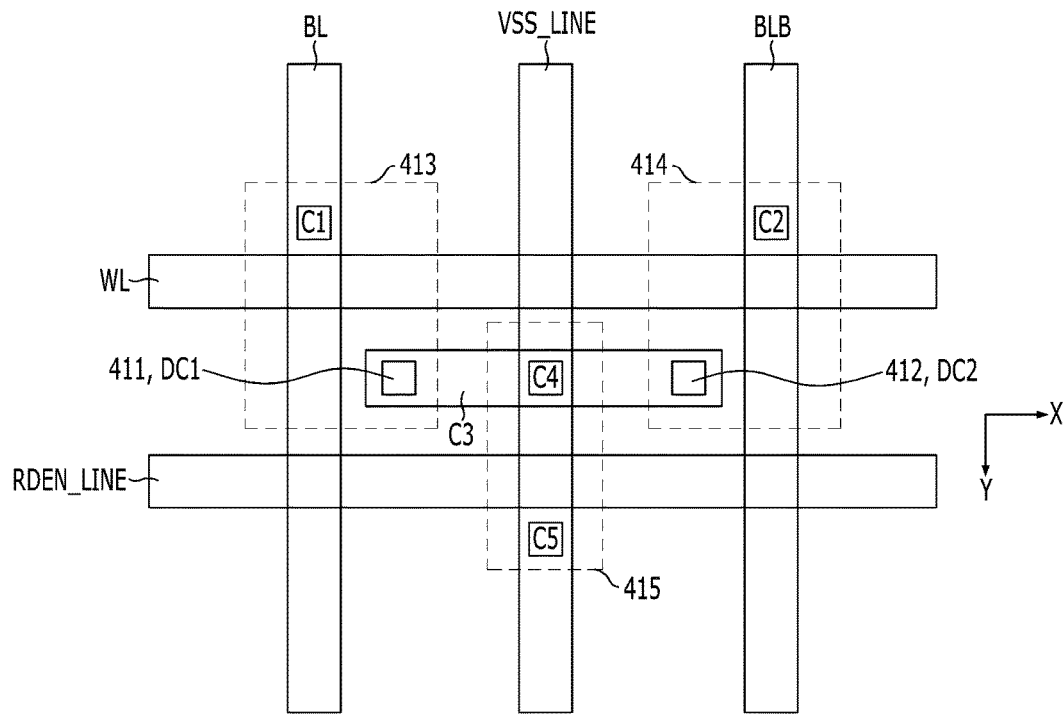
FIG. 5A is a plan view illustrating an example of the memory circuit (device) of FIG. 4 that includes a storage cell 410, a bit line BL, a bit line bar BLB, a word line WL, a read signal line RDEN_LINE, and a ground voltage line VSS_LINE
Figure 5B:
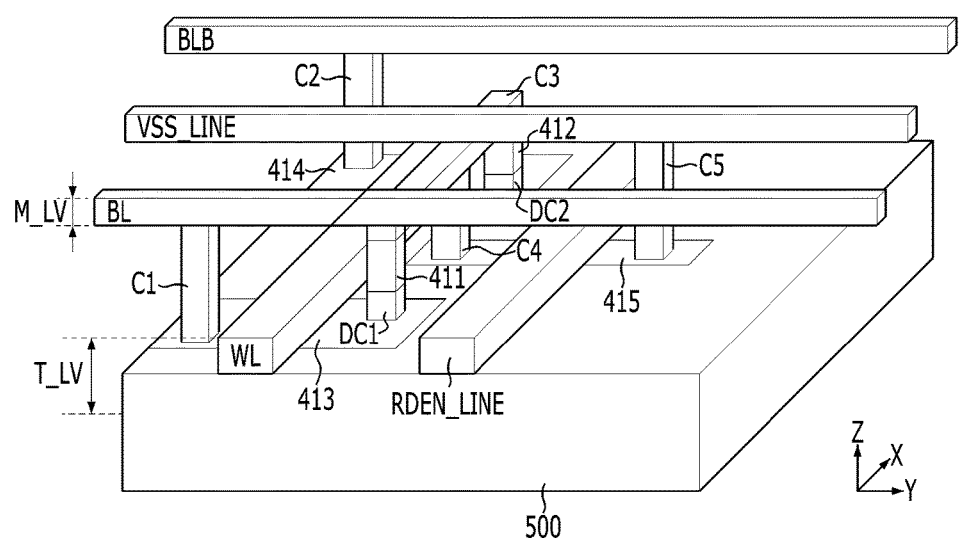
FIG. 5B is a perspective view illustrating an example of the memory circuit (device) of FIG. 4 that includes a storage cell 410, a bit line BL, a bit line bar BLB, a word line WL, a read signal line RDEN_LINE, and a ground voltage line VSS_LINE.

FIGS. 5A and 5B are a plan view and a perspective view of the memory circuit (device) of FIG. 4 based on one circuit arrangement configurations. The memory circuit (device) includes the storage cell 410, the bit line BL, the bit line bar BLB, the word line WL, the read signal line RDEN_LINE, and the ground voltage line VSS_LINE. In FIGS. 5A and 5B, the ground voltage line VSS_LINE is extended in a direction Y parallel to the bit lines BL and the bline line bars BLB.

The memory circuits or devices of FIGS. 4, 5A, and 5B include the storage cell 410 and the surrounding components BL, BLB, WL, RDEN_LINE, and VSS_LINE. As illustrated in FIG. 5B, the components of the memory circuits may be formed over a substrate 500 doped with a P-type or N-type semiconductor. A metal level M_LV may indicate the level at which metal lines are formed over the substrate, and a transistor level T_LV may indicate the level at which transistors and metal lines coupled to the gates of the transistors are formed over the substrate.

The bit line BL and the bit line bar BLB may be formed at the metal level M_LV, and extended in the direction Y parallel to each other. The word line WL may be formed at the transistor level T_LV lower than the metal level M_LV, and extended in a direction X perpendicular to the bit line BL and bit line bar BLB. The first selecting element 413 may be formed at the transistor level T_LV. One end of the first selecting element 413 may be coupled to the bit line BL through a first contact C1 and a gate of the first selecting element 413 may be coupled to the word line WL. The second selecting element 414 may be formed at the transistor level T_LV. One end of the second selecting element 414 may be coupled to the bit line bar BLB through a second contact C2 and a gate of the second selecting element 414 may be coupled to the word line WL.

The first variable resistance element 411 may be formed between the metal level M_LV and the transistor level T_LV. One end A1 of the first variable resistance element 411 may be coupled to the other end of the first selecting element 413 through a down contact DC1. The second variable resistance element 412 may be formed between the metal level M_LV and the transistor level T_LV. One end A2 of the second variable resistance element 412 may be coupled to the other end of the second selecting element 414 through a down contact DC2. As illustrated in FIG. 5B, the variable resistance elements 411 and 412 may be extended in a direction Z perpendicular to the XY plane. The other end B1 of the first variable resistance element 411 and the other end B2 of the second variable resistance element 412 may be formed between the metal level M_LV and the transistor level T_LV, and coupled through a third contact C3 extended in the direction X perpendicular to the bit line BL and bit line bar BLB.

The sinking element 415 may be formed at the transistor level T_LV. One end of the sinking element 415 (e.g., the drain or source terminal of the transistor 415) may be coupled to the other end B1 of the first variable resistance element 411 and the other end B2 of the second variable resistance element 412. The one end of the sinking element 415 may be coupled to the third contact C3 through a fourth contact C4. Thus, the one end of the sinking element 415 may be coupled to the other end B1 of the first variable resistance element 411 and the other end B2 of the second variable resistance element 412 through the third and fourth contacts C3 and C4. The other end of the sinking element 415 (e.g., the source or drain of the transistor 415) may be coupled to the ground voltage line VSS_LINE. A gate of the sinking element 4145 may be coupled to the read signal line RDEN_LINE. The read signal line RDEN_LINE may be formed at the transistor level T_LV, extended in the direction X perpendicular to the bit line BL and bit line bar BLB, and coupled to the gate of the sinking element 415. The read enable signal RDEN may be applied to the read signal line RDEN_LINE.

The ground voltage line VSS_LINE may be formed at the metal level M_LV, disposed between the bit line BL and the bit line bar BLB, extended in the direction Y parallel to the bit line BL and bit line bar BLB, and coupled to the other end of the sinking element 415. The ground voltage VSS may be applied to the ground voltage line VSS_LINE. The other end of the sinking element 415 may be coupled to the ground voltage line VSS_LINE through a fifth contact C5.

In the memory circuit (device) illustrated in FIG. 5, since the ground voltage line VSS_LINE is positioned between the bit line BL and the bit line bar BLB, the data of the bit line BL and the data of the bit line bar BLB may be prevented from being influenced by the voltages thereof due to shielding effect. Furthermore, since the ground voltage line VSS_LINE is extended in the direction Y, the number of components extended in the direction X may be decreased to thereby increase the integration degree of the components extended in the direction X of the memory circuit or device.

Figure 6A:
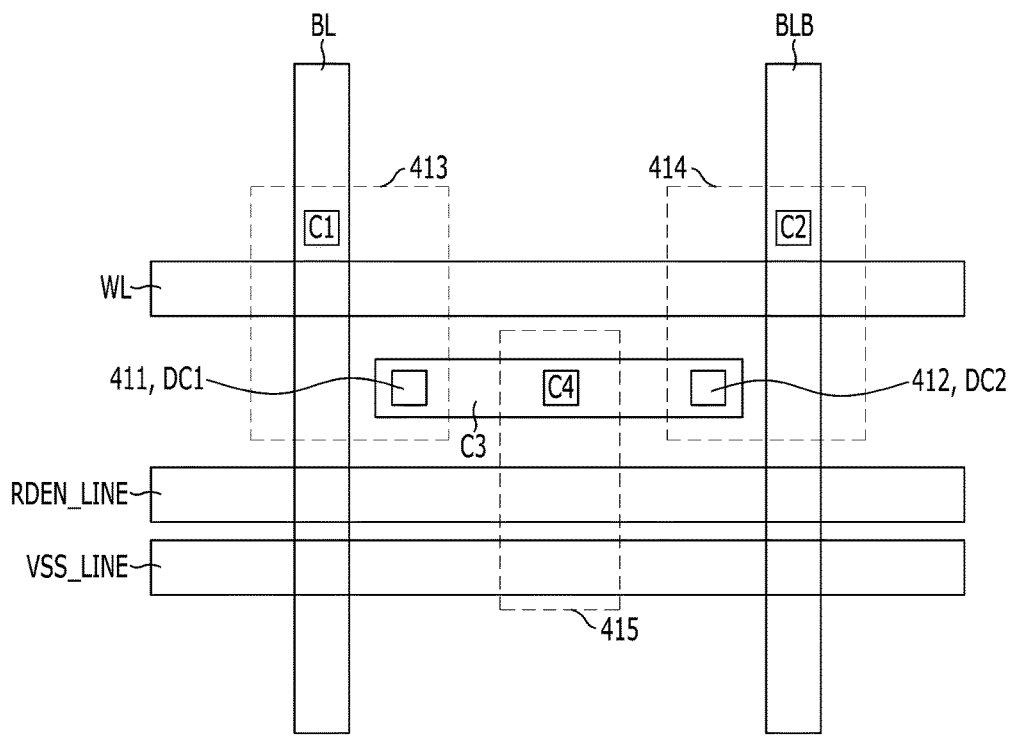
FIG. 6A is a plan view illustrating another example of the memory circuit (device) of FIG. 4 that includes a storage cell 410, a bit line BL, a bit line bar BLB, a word line WL, a read signal line RDEN_LINE, and a ground voltage line VSS_LINE.
Figure 6B:
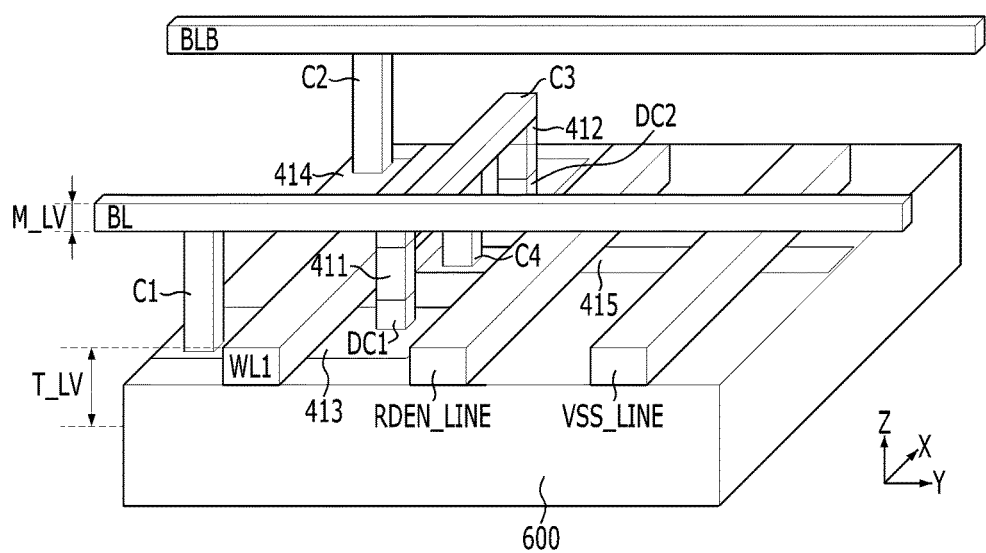
FIG. 6B is a perspective view illustrating another example of the memory circuit (device) of FIG. 4 that includes a storage cell 410, a bit line BL, a bit line bar BLB, a word line WL, a read signal line RDEN_LINE, and a ground voltage line VSS_LINE.

FIGS. 6A and 6B are a plan view and a perspective view of the memory circuit or device of FIG. 4 in a different configuration from FIGS. 5A and 5B. The illustrated memory circuit or device includes the storage cell 410, the bit line BL, the bit line bar BLB, the word line WL, the read signal line RDEN_LINE, and the ground voltage line VSS_LINE. In FIGS. 6A and 6B, the ground voltage line VSS_LINE is extended in the direction X perpendicular to the bit lines BL/BLB.

FIGS. 4, 6A, and 6B illustrate the arrangement of the storage cell 410 and the surrounding components BL/BLB, WL, RDEN_LINE, and VSS_LINE. As illustrated in FIG. 6B, the components of the memory circuit (device) may be formed over a substrate 600 doped with a P-type or N-type semiconductor. The metal level M_LV may indicate the level at which metal lines are formed, and the transistor level T_LV may indicate the level at which transistors and metal lines coupled to the gates of the transistors are formed.

The bit line BL and the bit line bar BLB may be formed at the metal level M_LV, and extended in the direction Y parallel to each other. The word line WL may be formed at the transistor level T_LV lower than the metal level M_LV, and extended in the direction X perpendicular to the bit line BL and bit line bar BLB. The first selecting element 413 may be formed at the transistor level T_LV. The first selecting element 413 may have one end coupled to the bit line BL through a first contact C1 and a gate coupled to the word line WL. The second selecting element 414 may be formed at the transistor level T_LV. The second selecting element 414 may have one end coupled through the bit line bar BLB through a second contact C2 and a gate coupled to the word line WL.

The first variable resistance element 411 may be formed between the metal level M_LV and the transistor level T_LV. One end A1 of the variable resistance element 411 may be coupled to the other end of the first selecting element 413 through a down contact DC1. The second variable resistance element 412 may be formed between the metal level M_LV and the transistor level T_LV. One end A2 of the second variable resistance element 412 may be coupled to the other end of the second selecting element 414 through a down contact DC2. As illustrated in FIG. 6B, the variable resistance elements 411 and 412 may be extended in a direction Z perpendicular to the XY plane. The other end B1 of the first variable resistance element 411 and the other end B2 of the second variable resistance element 412 may be formed between the metal level M_LV and the transistor level T_LV, and coupled through a third contact C3 extended in the direction X perpendicular to the bit line BL and bit line bar BLB.

The sinking element 415 may be formed at the transistor level T_LV, and have three terminals. One terminal is coupled to the other end B1 of the first variable resistance element 411 and the other end B2 of the second variable resistance element 412. The one end of the sinking element 415 may be coupled to the third contact C3 through a fourth contact C4. Thus, the one end of the sinking element 415 may be coupled to the other end B1 of the first variable resistance element 411 and the other end B2 of the second resistance element 412 through the third and fourth contacts C3 and C4. The other terminal is coupled to the ground voltage line VSS_LINE. Another terminal which functions as a gate is coupled to the read signal line RDEN_LINE. The read signal line RDEN_LINE may be formed at the transistor level T_LV, extended in the direction X perpendicular to the bit line BL and bit line bar BLB, and coupled to the gate of the sinking element 415. The read enable signal RDEN may be applied to the read signal line RDEN_LINE.

The ground voltage line VSS_LINE may be formed at the transistor level T_LV, extended in the direction X parallel to the bit line BL and bit line bar BLB, and coupled to the other end of the sinking element 415. The ground voltage VSS may be applied to the ground voltage line VSS_LINE. The other end of the sinking element 415 may be directly coupled to the ground voltage line VSS_LINE.

In the memory circuit or device illustrated in FIGS. 6A and 6B, since the ground voltage line VSS_LINE is positioned at the transistor level T_LV and extended in the direction X, the number of components extended in the direction Y may be decreased to thereby increase the integration degree of the components extended in the direction Y of the memory circuit or device.

The configurations of the memory circuits or devices of FIGS. 5A-5B and FIGS. 6A-6B are different from each other in terms of their arrangements of the ground voltage line VSS_LINE. For example, the direction forming the ground voltage line VSS_LINE may change depending on various conditions. For example, if it is easy or necessary to reduce the pitch in the direction X, the ground voltage line VSS_LINE may be formed in the direction Y. If it is easy or necessary to reduce the pitch in the direction Y, the ground voltage line VSS_LINE may be formed in the direction X. The integration degree of the memory circuit (device) may be increased. For reference, the first selecting element 413, the second selecting element 414, and the sinking element 415 may be formed with MOS transistors.

Figure 7:
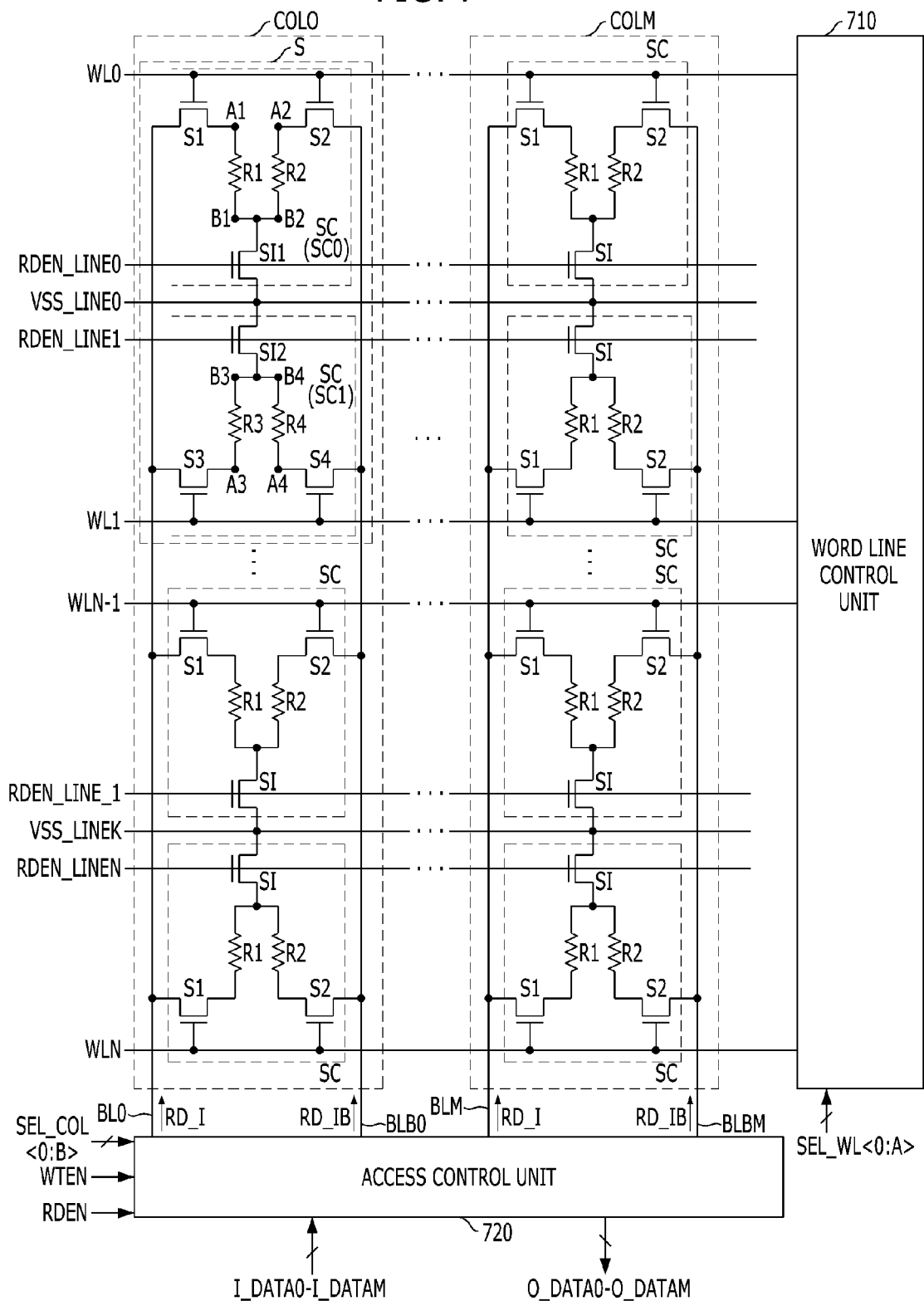
FIG. 7 is a configuration of a memory circuit (device) which includes a storage cell SC having two variable resistance elements R1 and R2.

FIG. 7 shows an example of a configuration of a memory circuit or device having columns of storage cells SC with each storage cell SC including two variable resistance elements R1 and R2 in a storage cell arrangement similar to the storage cell in FIG. 4.

As illustrated in FIG. 7, the memory circuit may include one or more columns COL0 to COLM, a plurality of word lines WL0 to WLN, a plurality of read signal lines RDEN_LINE0 to RDEN_LINEN, a plurality of ground voltage lines VSS_LINE0 to VSS_LINEK, a word line control unit 710, and an access control unit 720.

The one or more columns COL0 to COLM may include bit lines BL0 to BLM, bit line bars BLB0 to BLBM, and a plurality of storage cells SC coupled between the bit lines BL0 to BLM and the bit line bars BLB0 to BLBM. The bit lines and the bit line bars are spatially interleaved so that a bit line is next to a bit line bar without being next to another bit line. A bit line and its adjacent bit line bar form a pair of lines between which a column of storage cells are coupled. Each of the storage cells SC may include a first selecting element S1, a second element S2, a first variable resistance element R1, a second variable resistance element R2, and a sinking element SI. The couplings and operations of the first selecting element S1, the second selecting element S2, the first variable resistance element R1, the second variable resistance element R2, and the sinking element SI, which are included in the storage cell SC of FIG. 7, may be the same as the first selecting element 411, the second selecting element 412, the first variable resistance element 413, the second variable resistance element 414, and the sinking element 415, which are included in the storage cell 410 of FIG. 4.

The word line control unit 710 may activate a selected word line among the plurality of word lines WL0 to WLN in response to word line select information SEL_WL<0:A>. The word line control unit 710 may apply a voltage to the selected word line to turn on the selecting elements S1 and S2 coupled to the selected word line.

The access control unit 720 may provide a proper current to flow in a selected storage cell SC during a read or write operation. The access control unit 720 may select one or more columns among the plurality of columns COL0 to COLM in response to column select information SEL_COL<0:B>. The access control unit 720 may pass a proper current to the selected column and access the selected storage cell SC.

When a write enable signal WTEN is activated during a write operation, the access control unit 720 may pass a switching current to the selected storage cell SC of the selected column in a direction determined by input data I_DATA0 to I_DATAM. For example, consider using the-variable resistance elements R1 and R2 that are coupled as configured in the memory circuit or device of FIG. 4 for each storage cell SC in FIG. 7. When the input data is low data, the access control unit 720 may provide the switching current to flow from the bit line bar to the bit line of the selected column. When the input data is high data, and the access control unit 720 may provide the switching current to flow from the bit line to the bit line bar. For this operation, the access control unit 720 may drive the bit line and the bit line bar of the selected column to the voltage determined by the input data.

When a read enable signal RDEN is activated during a read operation, the access control unit 720 may pass a first and a second read currents RD_I and RD_IB to the first and the second variable resistance elements R1 and R2, respectively, of the selected storage cell SC of the selected column. The access control unit 720 may compare the first and second read currents RD_I and RD_IB to determine data stored in the selected storage cell and output determined data as read data. For this operation, the access control unit 720 may drive the bit line and bit line bar of the selected column to the voltage required for passing the read currents RD_I and RD_IB to the storage cell SC.

During the read operation, the read enable signal RDEN may be applied to turn on the sinking element SI from the corresponding read signal line RDEN_LINE0 to RDEN_LINEN. When the sinking element SI is turned on, the ground voltage VSS may be applied to the variable resistance elements R1 and R2 from the corresponding ground voltage line of the ground voltage lines VSS_LINE0 to VSS_LINEK. In the selected storage cell SC, the first read current RD_I may flow into the corresponding ground voltage line through the corresponding bit line, the first variable resistance element R1, and the sinking element SI, and the second read current RD_IB may flow into the corresponding ground voltage line through the corresponding bit line bar, the second variable resistance element R2, and the sinking element SI.

Figure 8:
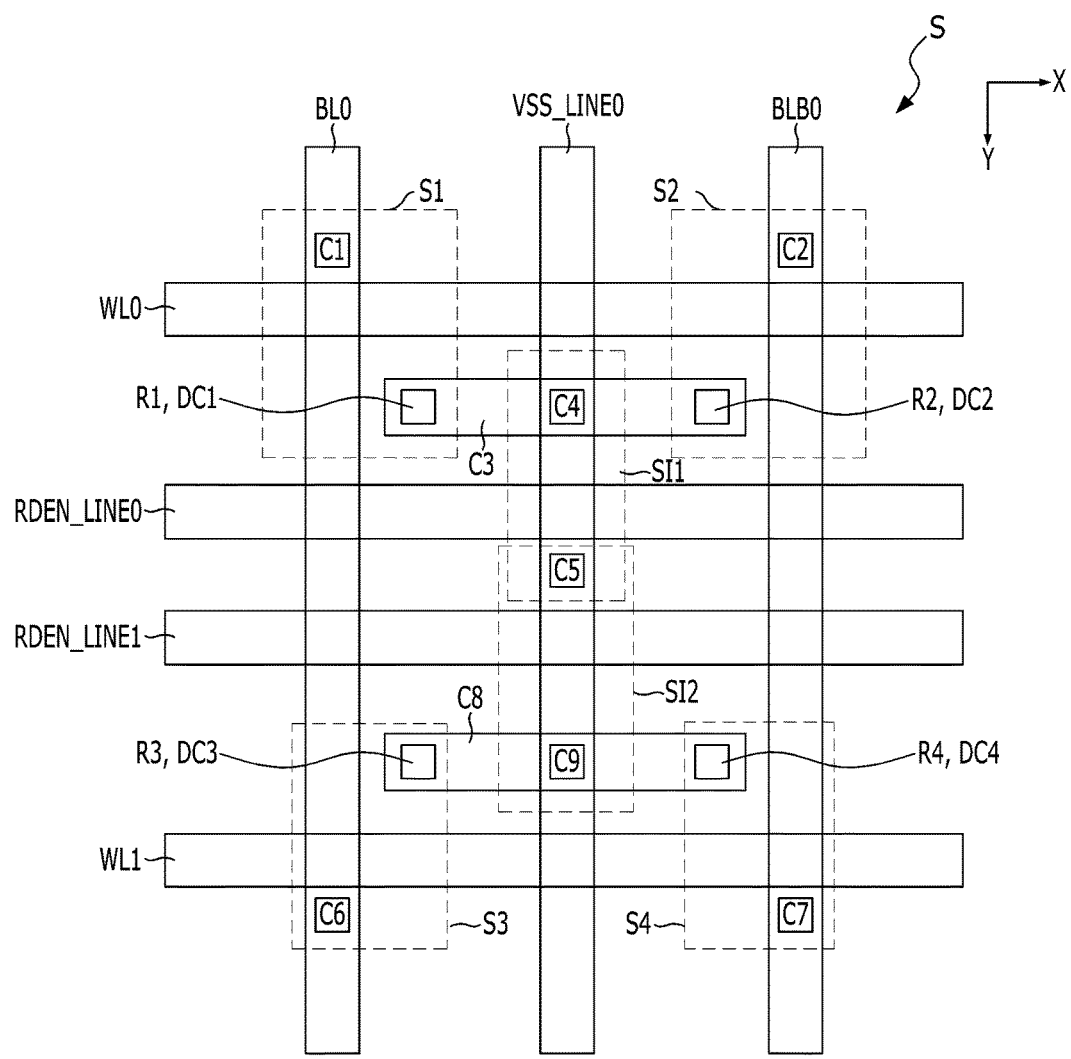
FIG. 8 is a plan view of an area S indicated in FIG. 7.
Figure 9:
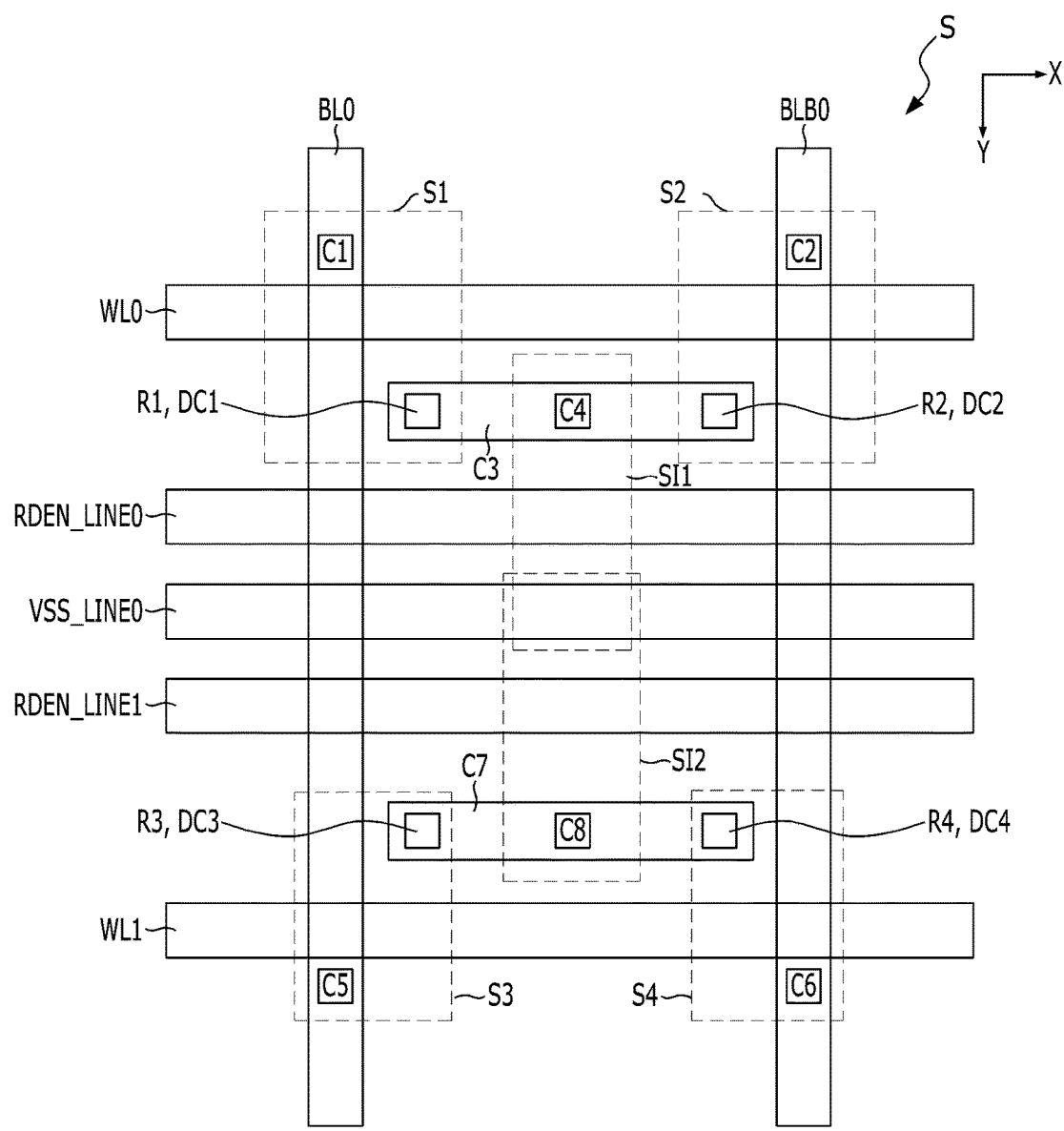
FIG. 9 is another plan view of the area S indicated in FIG. 7.

As illustrated in FIG. 7, two adjacent storage cells SC within a column of storage cells SC are arranged to share the same VSS_LINE line for their respective sinking elements 415 in a mirror-image pattern between their respective word lines on opposite sides of the shared VSS_LINE line in a direction that the bit line and the bit line bar extend. Each of the ground voltage lines VSS_LINE0 to VSS_LINEK is shared by two adjacent storage cells SC. FIGS. 8 and 9 illustrate plan views of an area S in which two adjacent storage cells SC are arranged.

Within each storage cell SC of FIG. 7, the first and second variable resistance elements R1 and R2 in the storage cell SC shave opposite resistance values of the two different resistance values for each variable resistance element. For example, if the first variable resistance element R1 has the first resistance value, the second variable resistance element R2 will have the other resistance value, i.e., the second resistance value. If the first variable resistance element R1 has the second resistance value, the second variable resistance element will have the first resistance value. Since the opposite resistance values of the first and second variable resistance elements R1 and R2 are compared during a read operation, the margin may increase to correspond to a difference between the first and second resistance values. As the margin is increased, the time required for sensing data during the read operation may be reduced. As a result, the memory circuit or device including the storage cells of FIG. 7 may perform a high-speed operation.

FIG. 7 illustrates a circuit diagram to show electrical connections and relationships of different circuit components rather than the actual layout of the components included in the memory circuit or device. Thus, the positions at which the elements and lines are disposed and the directions in which the elements and lines are extended as shown in FIG. 7 may differ from the actual layout of the components.

FIG. 8 is an example of a plan view of the actual circuit layout in the area S indicated in FIG. 7. FIG. 8 illustrates an example in which the ground voltage line VSS_LINE0 is extended in the direction Y parallel to the bit lines BL0 and BLB0.

Referring to FIGS. 5A, 7, and 8, the area S includes an arrangement of two storage cells SC and other components BL0, BLB0, WL0, WL1, RDEN_LINE0, RDEN_LINE1, and VSS_LINE0. Hereafter, the storage cell SC0 coupled to the first word line WL0 may be referred to as the first storage cell SC0, and the storage cell SC1 coupled to the second word line WL1 may be referred to as the second storage cell SC1. The first storage cell SC0 may include a first selecting element S1, a second selecting element S2, a first variable resistance element R1, a second variable resistance element R2, and a first sinking element SI1. The second storage cell SC1 may include a third selecting element S3, a fourth selecting element S4, a third variable resistance element R3, a fourth variable resistance element R4, and a second sinking element SI2.

The bit line BL0 and the bit line bar BLB0 may be formed at the metal level M_LV, and extended in the direction Y parallel to each other. The ground voltage line VSS_LINE0 may be formed at the metal level M_LV, extended in the direction Y parallel to the bit line BL0 and the bit line bar BLB0, and disposed between the bit line BL0 and the bit line bar BLB0.

The first word line WL0 and the second word line WL1 may be formed at the transistor level T_LV, and extended in the direction X perpendicular to the bit line BL0 and the bit line bar BLB0. The elements S1, S2, R1, R2, and SI1 of the first storage cell SC0 may be arranged in the same manner as the elements 411 to 415 illustrated in FIG. 5, and coupled to the surrounding components BL0, BLB0, WL0, RDEN_LINE0, and VSS_LINE0 as illustrated in FIG. 5. The elements S3, S4, R3, R4, and SI2 of the second storage cell SC1 may be arranged in the mirror-image pattern to face the respective elements 411 to 415 of FIG. 5 in the direction Y, and coupled to the surrounding components BL1, BLB1, WL1, RDEN_LINE1, and VSS_LINE 1 as illustrated in FIG. 5.

The first selecting element S1 may be coupled through the bit line BL0 through a first contact C1, and the second selecting element S2 may be coupled to the bit line bar BLB0 through a second contact C2. The first variable resistance element R1 may have one end A1 coupled to the first selecting element S1 through a down contact DC1, and the second variable resistance element R2 may have one end A2 coupled to the second selecting element S2 through a down contact DC2. The other end of the first variable resistance element R1 and the other end of the second variable resistance element R2 may be coupled through a third contact C3. The first sinking element SI1 may have one end coupled to the third contact C3 through a fourth contact C4.

The third selecting element S3 may be coupled to the bit line BL through a sixth contact C6, and the fourth selecting element S4 may be coupled to the bit line bar BLB0 through a seventh contact C7. The third variable resistance element R3 may have one end A3 coupled to the third selecting element S3 through a down contact DC3, and the fourth variable resistance element R4 may have one end A4 coupled to the fourth selecting element S4 through a down contact DC4. The other end B3 of the third variable resistance element R3 and the other end B4 of the second variable resistance element R4 may be coupled through an eighth contact C8. The second sinking element SI2 may have one end coupled to the eighth contact C8 through a ninth contact C9.

The other end of the first sinking element SI1 and the other end of the second sinking element SI2 may be coupled to the ground voltage line VSS_LINE0 through a fifth contact C5.

FIG. 9 is another plan view of the area S indicated in FIG. 7. In FIG. 9, the ground voltage line VSS_LINE0 is extended in the direction X perpendicular to the bit lines BL0 and BLB0.

Referring to FIGS. 6A, 7, and 9, an arrangement of two storage cells SC and other components BL0, BLB0, WL0, WL1, RDEN_LINE0, RDEN_LINE1, and VSS_LINE0 in the area S will be described. The storage cell SC0 coupled to the first word line WL0 may be referred to as the first storage cell SC0, and the storage cell SC1 coupled to the second word line WL1 may be referred to as the second storage cell SC1. The first storage cell SC0 may include a first selecting element S1, a second selecting element S2, a first variable resistance element R1, a second variable resistance element R2, and a first sinking element SI1. The second storage cell SC1 may include a third selecting element S3, a fourth selecting element S4, a third variable resistance element R3, a fourth variable resistance element R4, and a second sinking element SI2.

The bit line BL0 and the bit line bar BLB0 may be formed at the metal level M_LV, and extended in the direction Y parallel to each other. The ground voltage line VSS_LINE0 may be formed at the transistor level M_LV, extended in the direction X perpendicular to the bit line BL0 and the bit line bar BLB0, and disposed between the first and second read signal lines RDEN_LINE0 and RDEN_LINE1.

The first word line WL0 and the second word line WL1 may be formed at the transistor level T_LV, and extended in the direction X perpendicular to the bit line BL0 and the bit line bar BLB0. The elements S1, S2, R1, R2, and SI1 of the first storage cell SC0 may be arranged in the same manner as the elements 411 to 415 illustrated in FIG. 5, and coupled to the surrounding components BL0, BLB0, WL0, RDEN_LINE0, and VSS_LINE0 as illustrated in FIG. 5. The elements S3, S4, R3, R4, and SI2 of the second storage cell SC1 may be arranged in the mirror-image pattern to face the respective elements 411 to 415 of FIG. 5 in the direction Y, and coupled to the surrounding components BL1, BLB1, WL1, RDEN_LINE1, and VSS_LINE1 as illustrated in FIG. 5.

The first selecting element S1 may be coupled through the bit line BL0 through a first contact C1, and the second selecting element S2 may be coupled to the bit line bar BLB0 through a second contact C2. The first variable resistance element R1 may have one end A1 coupled to the first selecting element S1 through a down contact DC1, and the second variable resistance element R2 may have one end A2 coupled to the second selecting element S2 through a down contact DC2. The other end of the first variable resistance element R1 and the other end of the second variable resistance element R2 may be coupled through a third contact C3. The first sinking element SI1 may have one end coupled to the third contact C3 through a fourth contact C4.

The third selecting element S3 may be coupled to the bit line BL0 through a fifth contact C5, and the fourth selecting element S4 may be coupled to the bit line bar BLB0 through a sixth contact C6. The third variable resistance element R3 may have one end A3 coupled to the third selecting element S3 through a down contact DC3, and the fourth variable resistance element R4 may have one end A4 coupled to the fourth selecting element S4 through a down contact DC4. The other end B3 of the third variable resistance element R3 and the other end B4 of the second variable resistance element R4 may be coupled through a seventh contact C7. The second sinking element SI2 may have one end coupled to the eighth contact C8 through an eighth contact C8.

The other end of the first sinking element SI1 and the other end of the second sinking element SI2 may be directly coupled to the ground voltage line VSS_LINE0.

The electronic devices in accordance with the above-described implementations include two variable resistance elements in each storage cell. With the two variable resistance element, since the difference between resistance values stored in storage cells increases, the margin and speed of the read operation may be improved.

The above and other memory circuits or semiconductor devices based on the disclosed technology can be used in a range of devices or systems. FIGS. 10-14 provide some examples of devices or systems that can implement the memory circuits disclosed herein.

Figure 10:
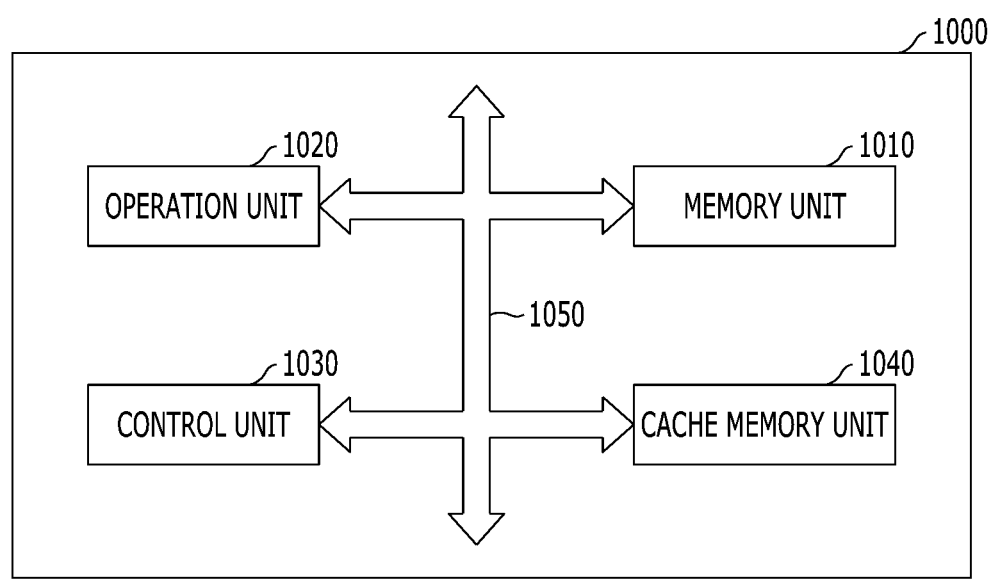
FIG. 10 shows an example of a configuration diagram of a microprocessor implementing memory circuitry based on the disclosed technology.

FIG. 10 shows an example of a configuration diagram of a microprocessor based on another implementation of the disclosed technology.

Referring to FIG. 10, a microprocessor 1000 may perform tasks for controlling and tuning a series of processes of receiving data from various external devices, processing the data, and outputting processing results to external devices.

The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the memory unit 1010 may increase. Consequently, speed and stability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
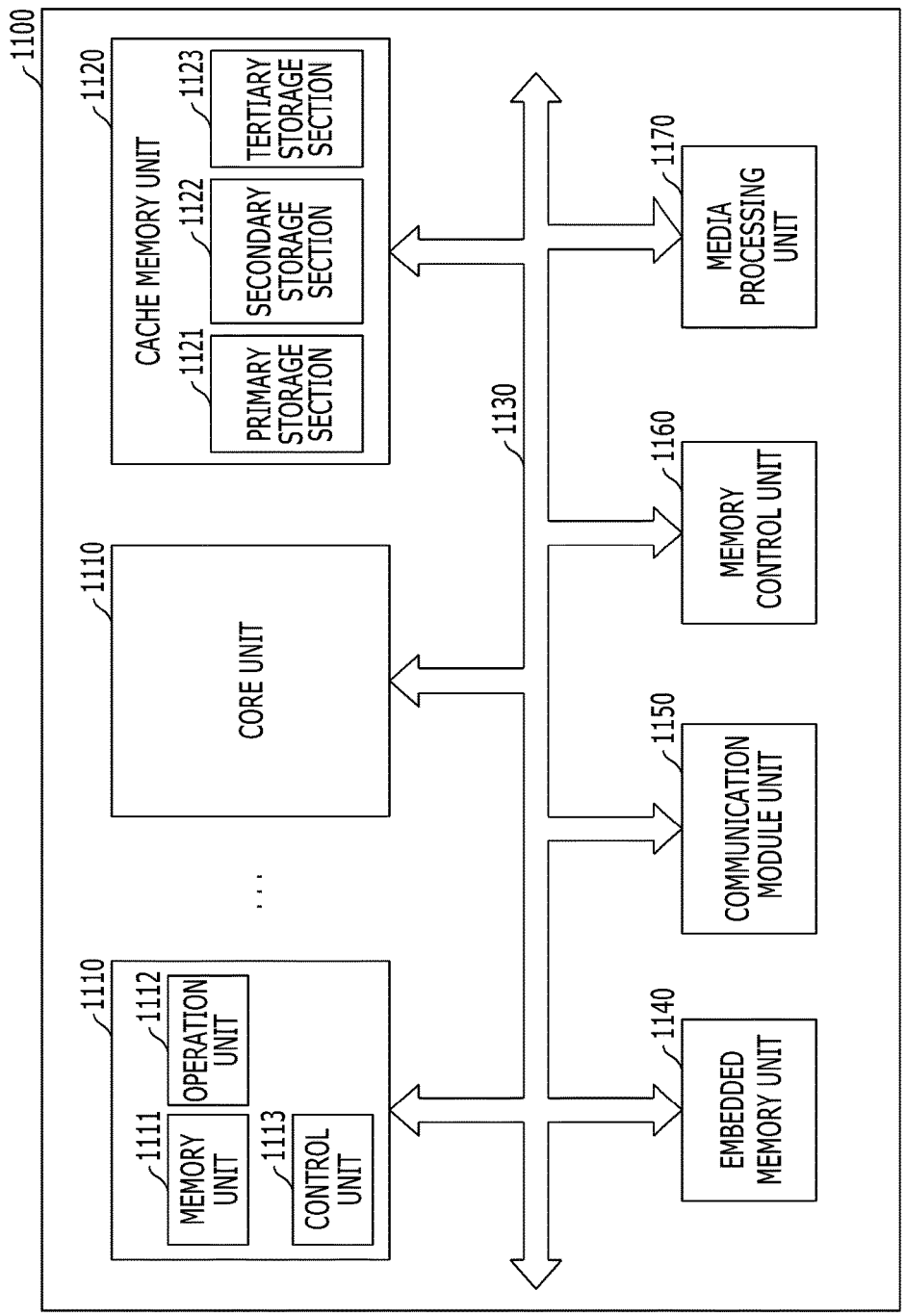
FIG. 11 shows an example of a configuration diagram of a processor implementing memory circuitry based on the disclosed technology.

FIG. 11 is a configuration diagram of a processor based on another implementation of the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the cache memory unit 1120 may increase. Consequently, speed and stability of the processor 1100 may be improved.

Although it was shown in FIG. 11 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130.The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
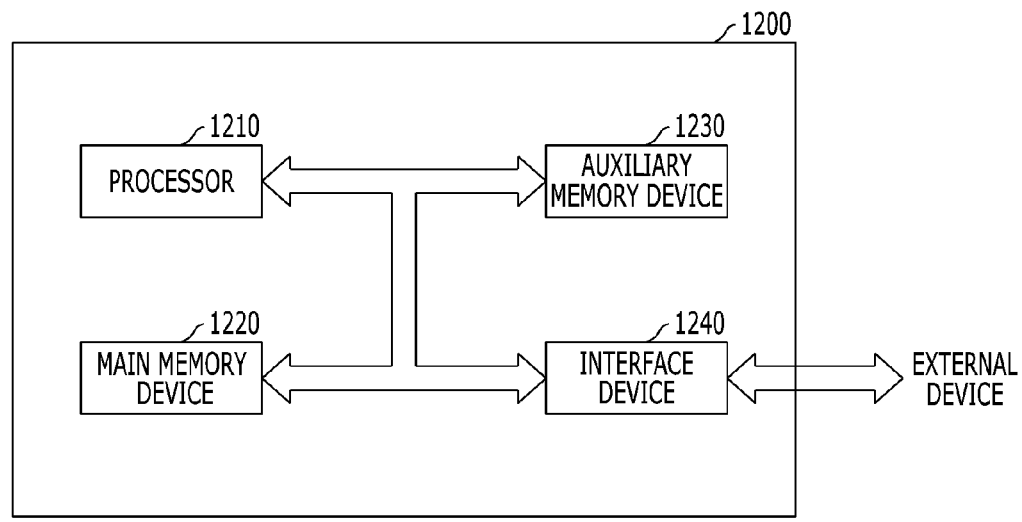
FIG. 12 shows an example of a configuration diagram of a system implementing memory circuitry based on the disclosed technology.

FIG. 12 is a configuration diagram of a system based on another implementation of the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the main memory device 1220 may increase. Consequently, speed and stability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the auxiliary memory device 1230 may increase. Consequently, speed and stability of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
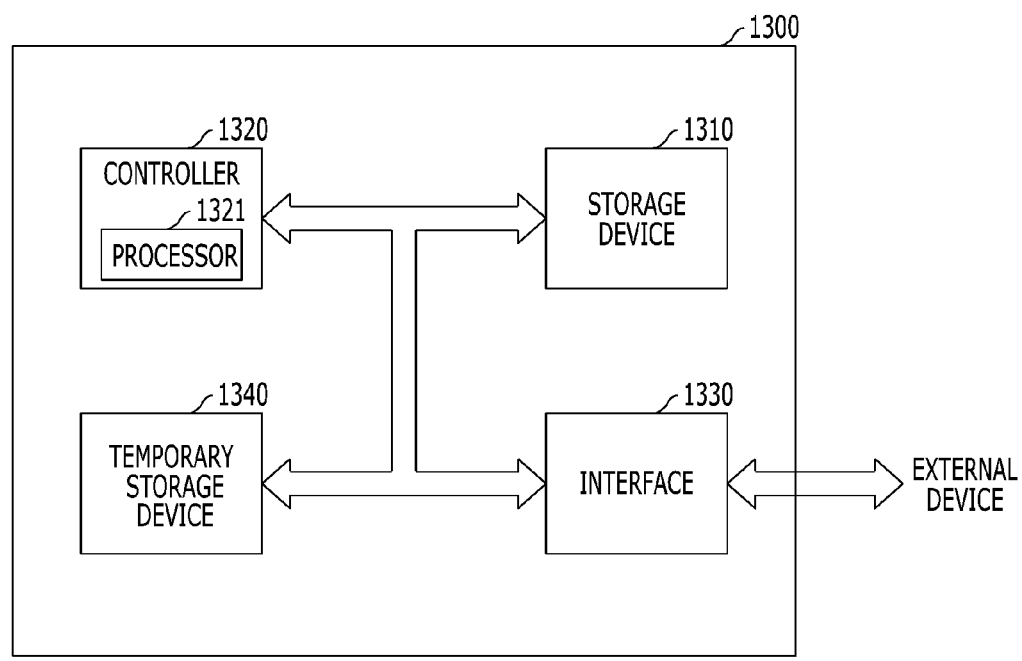
FIG. 13 shows an example of a configuration diagram of a data storage system implementing memory circuitry based on the disclosed technology.

FIG. 13 is a configuration diagram of a data storage system based on another implementation of the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the temporary storage device 1340 may increase. Consequently, speed and stability of the data storage system 1300 may be improved.

Figure 14:
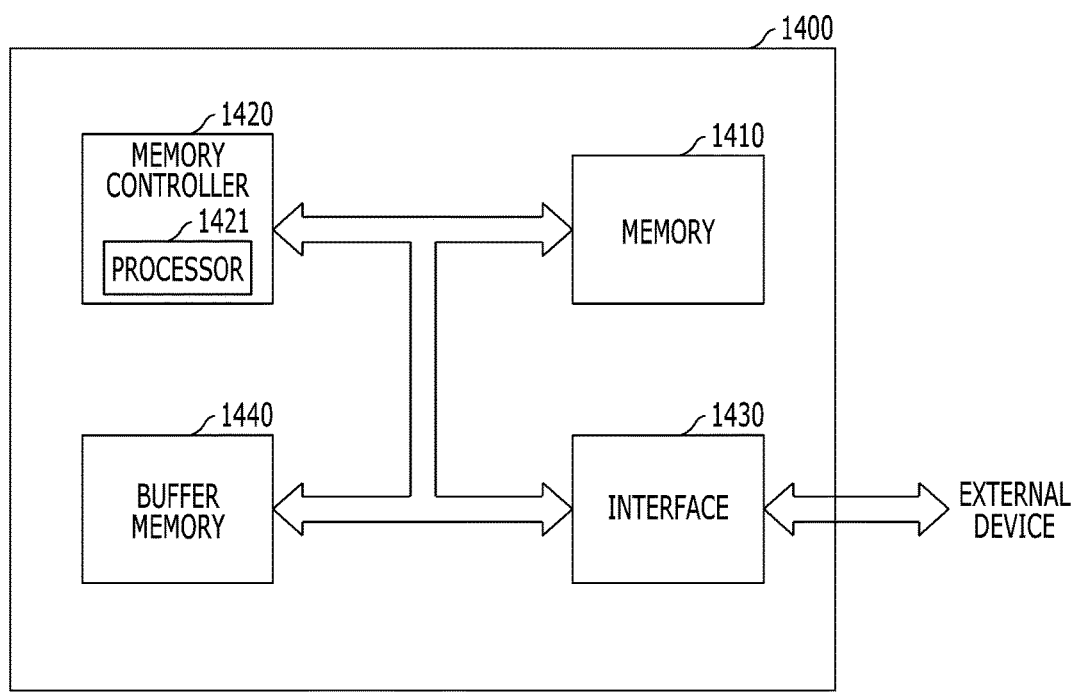
FIG. 14 shows an example of a configuration diagram of a memory system implementing memory circuitry based on the disclosed technology.

FIG. 14 is a configuration diagram of a memory system based on another implementation of the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the memory 1410 may increase. Consequently, speed and stability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a bit line and a bit line bar formed at a metal level, and extended in a direction to be parallel to each other; a first word line formed at a transistor level lower than the metal level, and extended in a direction perpendicular to the bit line or the bit line bar; a first selecting element formed at the transistor level and coupled to the bit line and the first word line, and operable to be turned on or off in response to a voltage of the first word line; a second selecting element formed at the transistor level and coupled to the bit line bar and the first word line, and operable to be turned on or off in response to the voltage of the first word line; a first variable resistance element formed between the metal level and the transistor level, and coupled to the first selecting element, the first variable resistance element configured to exhibit two different resistance values when a current flowing therethrough is switched between opposite directions; a second variable resistance element formed between the metal level and the transistor level, and coupled to the second selecting element, the second variable resistance element configured to exhibit two different resistance values when a current flowing therethrough is switched between opposite directions; and a first sinking element formed at the transistor level, coupled to the first and second variable resistance elements, and operable to supply a ground voltage to the first and second variable resistance elements when turned on. Through this, a read margin and a read speed of the buffer memory 1440 may increase. Consequently, speed and stability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit,
   wherein the semiconductor memory unit includes:
   a bit line and a bit line bar formed at a metal level, and extended in a direction to be parallel to each other;
   a first word line formed at a transistor level lower than the metal level;
   a first selecting element formed at the transistor level and coupled to the bit line and the first word line, and operable to be turned on or off in response to a voltage of the first word line;
   a second selecting element formed at the transistor level and coupled to the bit line bar and the first word line, and operable to be turned on or off in response to the voltage of the first word line;
   a first variable resistance element formed between the metal level and the transistor level, and coupled to the first selecting element, the first variable resistance element configured to exhibit two different resistance values when a current flowing therethrough is switched between opposite directions;
   a second variable resistance element formed between the metal level and the transistor level, and coupled to the second selecting element, the second variable resistance element configured to exhibit two different resistance values when a current flowing therethrough is switched between opposite directions;
   a second word line formed at the transistor level;
   a third selecting element formed at the transistor level and coupled to the bit line and the second word line, and operable to be turned on or off in response to a voltage of the second word line;
   a fourth selecting element formed at the transistor level, and coupled to the bit line bar and the second word line, and operable to be turned on or off in response to the voltage of the second word line;
   a third variable resistance element formed between the metal level and the transistor level, and coupled to the third selecting element, the third variable resistance element configured to exhibit two different resistance values when a current flowing therethrough is switched between opposite directions;
   a fourth variable resistance element formed between the metal level and the transistor level, and coupled to the fourth selecting element, the fourth variable resistance element configured to exhibit two different resistance values when a current flowing therethrough is switched between opposite directions;
   a ground voltage line configured to supply a ground voltage;
   a first sinking element formed at the transistor level, coupled to the first and second variable resistance elements, and coupled to the ground voltage line;
   a second sinking element formed at the transistor level, coupled to the third and fourth variable resistance elements, and coupled to the ground voltage line;
   a first read signal line formed at the transistor level, coupled to a gate of the first sinking element, and operable to turn on the first sinking element during a read operation;
   a second read signal line formed at the transistor level, coupled to a gate of the second sinking element, and operable to turn on the second sinking element during a read operation, and
   wherein the first word line, the first read signal line, the second read signal line, and the second word line are sequentially arranged,
   wherein the first word line, the first read signal line, the second read signal line, and the second word line are extended in a direction perpendicular to the bit line or the bit line bar.

2. The electronic device of claim 1, wherein the semiconductor memory unit further includes:
   a first contact formed between the transistor level and the metal level to couple the bit line to the first selecting element; and
   a second contact formed between the transistor level and the metal level to couple the bit line bar to the second selecting element.

3. The electronic device of claim 2, wherein the semiconductor memory unit further includes:
   a third contact formed between the metal level and the transistor level and extended in the direction perpendicular to the bit line or the bit line bar to be coupled with the first and second variable resistance elements; and
   a fourth contact coupling the third contact to the sinking element.

4. The electronic device of claim 1, wherein the first and second sinking elements are coupled to each other to receive a common ground voltage to supply to the first and second variable resistance elements from the first sinking element and to the third and fourth variable resistance elements from the second sinking element.

5. The electronic device of claim 1, wherein the semiconductor memory unit includes control circuitry configured to compare a current flowing in the first variable resistance element with a current flowing in the second variable resistance element during a read operation.

6. The electronic device of claim 1,
   wherein the two different resistance values of each of the first, second, third and fourth variable resistance elements are a high resistance value and a low resistance value, and
   wherein the first and the second variable resistance elements are configured to exhibit opposite resistance values when a current is direct in the same direction to flow through the first sinking element, and the third and the fourth variable resistance elements are configured to exhibit opposite resistance values when a current is direct in the same direction to flow through the second sinking element.

7. The electronic device according to claim 1, further comprising a microprocessor which includes:

a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

8. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

9. The electronic device of claim 1, wherein the first and second variable resistance elements are structured and coupled in a first storage cell and the third and fourth variable resistance elements are structure and coupled in a second storage cell.

10. The electronic device of claim 9, wherein the first and second storage cells that are adjacent in a direction parallel to the bit line or the bit line bar are arranged to form a mirror-image pattern.

11. The electronic device of claim 1, wherein each variable resistance element in the semiconductor memory element includes a magnetic tunnel junction element that exhibits different resistance values for storing different data.

12. The electronic device of claim 11, wherein the first and second variable resistance elements are coupled to each other so that the first and second variable resistance elements exhibit different resistance values and collectively form a storage cell that stores data represented collectively by resistance states of the first and second variable resistance elements.

13. The electronic device of claim 1, the ground voltage line is formed at the metal level between the bit line and the bit line bar, extended in the direction parallel to the bit line or bit line bar.

14. The electronic device of claim 13, wherein the semiconductor memory unit includes a contact through which the first sinking element and the first ground voltage line are coupled.

15. The electronic device of claim 1, the ground voltage line formed at the transistor level between the first read signal line and the second read signal line, extended in the direction perpendicular to the bit line or bit line bar.

* * * * *